United States Patent
Ionescu et al.

(10) Patent No.: US 11,171,474 B2
(45) Date of Patent: Nov. 9, 2021

(54) ELECTRIC ARC DETECTION BASED ON FREQUENCY ANALYSIS

(71) Applicant: Infineon Technologies AG, Neubiberg (DE)

(72) Inventors: Mihai-Alexandru Ionescu, Graefelfing (DE); Michael Asam, Inchenhofen-Sainbach (DE); Louis Janinet, Le Puy Sainte Réparade (FR); Michael Ruprecht, Landsberg am Lech (DE); Redouane Djeghader, Munich (DE)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 16/552,986

(22) Filed: Aug. 27, 2019

(65) Prior Publication Data

US 2021/0066904 A1 Mar. 4, 2021

(51) Int. Cl.
*H02H 1/00* (2006.01)
*G01R 31/50* (2020.01)

(52) U.S. Cl.
CPC .......... *H02H 1/0015* (2013.01); *G01R 31/50* (2020.01)

(58) Field of Classification Search
CPC .... H02H 1/0015; H02H 1/0023; H02H 1/001; H02H 1/0038; H02H 1/0046; H02H 1/0053; G01R 31/50
See application file for complete search history.

(56) References Cited

U.S. PATENT DOCUMENTS

| | | | |
|---|---|---|---|
| 6,525,918 B1 | 2/2003 | Alles et al. | |
| 7,009,406 B2 | 3/2006 | Naidu et al. | |
| 7,062,388 B2 | 6/2006 | Rivers, Jr. et al. | |
| 2004/0263183 A1 | 12/2004 | Naidu et al. | |
| 2005/0207083 A1 | 9/2005 | Rivers, Jr. et al. | |
| 2008/0204950 A1* | 8/2008 | Zhou | H02H 1/0015 361/42 |
| 2009/0161270 A1* | 6/2009 | Beatty, Jr. | H02H 9/00 361/42 |
| 2011/0141644 A1* | 6/2011 | Hastings | H02H 1/0015 361/93.2 |
| 2013/0092208 A1* | 4/2013 | Robbins | H01L 31/02021 136/244 |
| 2013/0141112 A1 | 6/2013 | Potter et al. | |

(Continued)

FOREIGN PATENT DOCUMENTS

| | | |
|---|---|---|
| CN | 103913663 A | 7/2014 |
| CN | 108803560 A | 11/2018 |

(Continued)

*Primary Examiner* — Nguyen Tran
(74) *Attorney, Agent, or Firm* — Shumaker & Sieffert, P.A.

(57) ABSTRACT

In some examples, a device includes at least one input node configured to receive a signal indicating a current through a conductor to a load. The device also includes circuitry configured to determine a first magnitude of the received signal in a first frequency range by applying a first bandpass filter to the received signal. The circuitry is also configured to determine a second magnitude of the received signal in a second frequency range by applying a second bandpass filter to the received signal. The processing circuitry is further configured to determine that an electric arc has occurred on the conductor based on the first magnitude and the second magnitude.

23 Claims, 10 Drawing Sheets

(56) References Cited

U.S. PATENT DOCUMENTS

| | | | |
|---|---|---|---|
| 2014/0168843 A1* | 6/2014 | Privitera | G01R 31/50 361/93.1 |
| 2014/0320149 A1 | 10/2014 | Ecker et al. | |
| 2016/0187410 A1* | 6/2016 | Kolker | G01R 31/50 361/42 |
| 2018/0115144 A1* | 4/2018 | Murnane | H02S 50/10 |
| 2018/0351505 A1* | 12/2018 | Balog, Jr. | H02H 7/205 |
| 2018/0358924 A1* | 12/2018 | Kotowski | H02J 3/381 |
| 2019/0079132 A1* | 3/2019 | Chine | G01R 31/1272 |
| 2019/0288643 A1* | 9/2019 | Ikemoto | H02H 7/20 |
| 2019/0377021 A1* | 12/2019 | Bhalwankar | H02H 1/0007 |

FOREIGN PATENT DOCUMENTS

| | | |
|---|---|---|
| DE | 102015204376 A1 | 9/2016 |
| DE | 102015225442 A1 | 6/2017 |
| DE | 102016212184 A1 | 1/2018 |
| DE | 102016219851 A1 | 4/2018 |
| EP | 1289091 A2 | 3/2003 |

\* cited by examiner

ELECTRIC ARC DETECTION BASED ON FREQUENCY ANALYSIS

TECHNICAL FIELD

This disclosure relates to power electronics.

BACKGROUND

When an electric arc occurs in a power distribution system, the electric arc generates very high temperatures, which can melt wire isolation material. The electric arc can cause a short circuit between adjacent wires, which can quickly deplete a battery. The electric arc can also result in fire hazards, which are very dangerous for lithium-ion batteries.

Electric arcs become more likely as the voltage potential difference between two points increases. For example, the typical automotive system uses a 12-volt power system, but some vehicles now use a 48-volt power subsystem. Due to the higher voltages, and implicitly to the higher maximum sustaining distances, an electric arc can appear and be sustained much more easily in 48-volt systems, as compared to 12-volt systems. As a result, the prevention and detection of electric arcs is more important in 48-volts than in 12-volt systems.

48-volt power systems are more desirable than 12-volt power systems because a 48-volt power system uses lower electric currents. A conductor using a lower current can be designed with a smaller cross section. To prevent electric arcing, the 48-volt power system can be designed with thicker plastic insulation around the conductor. Thus, a 48-volt power system uses less metal and more plastic. When plastic is significantly cheaper than metal, it is cost effective to design a power system to operate at 48 volts because the cost reduction of using less metal will more than offset the increased cost of insulation. In addition, there is a weight savings associated with using plastic instead of metal.

SUMMARY

This disclosure describes techniques for determining that an electric arc has occurred on a conductor based on a frequency analysis. A device can receive a signal indicating a current through the conductor to a load. The device applies a first passband filter to the received signal to determine a first magnitude within a first frequency range. The device also applies a second passband filter to the received signal to determine a second magnitude within a second frequency range. The device can use the first and second determined magnitudes to determine whether an electric arc has occurred.

In some examples, a device includes at least one input node configured to receive a signal indicating a current through a conductor to a load. The device also includes circuitry configured to determine a first magnitude of the received signal in a first frequency range by applying a first bandpass filter to the received signal. The circuitry is also configured to determine a second magnitude of the received signal in a second frequency range by applying a second bandpass filter to the received signal. The circuitry is further configured to determine that an electric arc has occurred on the conductor based on the first magnitude and the second magnitude.

In some examples, a method includes receiving, by at least one node of a device, a signal indicating a current through a conductor to a load. The method also includes determining, by processing circuitry of the device, a first magnitude of the received signal in a first frequency range by applying a first bandpass filter to the received signal. The method further includes determining, by the processing circuitry, a second magnitude of the received signal in a second frequency range by applying a second bandpass filter to the received signal. The method includes determining, by the processing circuitry, that an electric arc has occurred on the conductor based on the first magnitude and the second magnitude.

In some examples, a device includes a computer-readable medium having executable instructions stored thereon, configured to be executable by processing circuitry for causing the processing circuitry to determine a first magnitude of a signal in a first frequency range by applying a first bandpass filter to the signal, wherein the signal indicates a current through a conductor to a load. The instructions are also configured to cause the processing circuitry to determine a second magnitude of a signal in a second frequency range by applying a second bandpass filter to the signal, wherein the signal indicates a current through a conductor to a load. The instructions are further configured to cause the processing circuitry to determine that an electric arc has occurred on the conductor based on the first magnitude and the second magnitude.

The details of one or more examples are set forth in the accompanying drawings and the description below. Other features, objects, and advantages will be apparent from the description and drawings, and from the claims.

DETAILED DESCRIPTION

Figure 1:
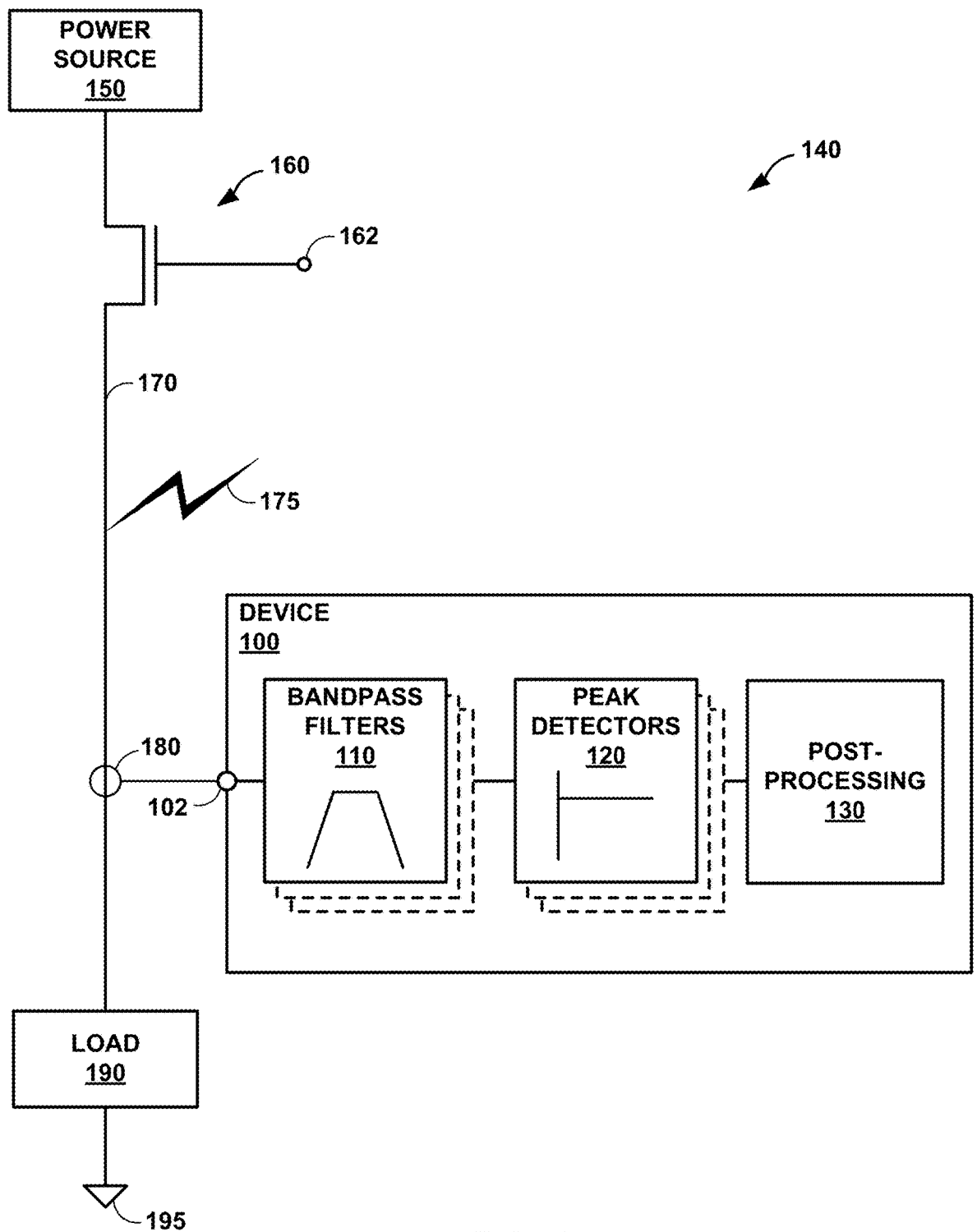
FIG. 1 is a conceptual block diagram of a device configured to determine that an electric arc has occurred on a conductor, in accordance with some examples of this disclosure.

FIG. 1 is a conceptual block diagram of a device 100 configured to determine that an electric arc 175 has occurred on a conductor 170, in accordance with some examples of this disclosure. System 140 includes device 100, power source 150, power switch 160, conductor 170, and load 190. System 140 may be part of an automotive system, an aviation system, a power generation system, a power distribution system, a power electronics system, and/or any other system where electric arc 175 can occur on conductor 170. System 140 may be referred to as a "boardnet" (e.g., a board network).

Power source 150 provides electrical power to power switch 160 and/or load 190. Power source 150 can include a battery, an electric generator, an alternator, a solar panel, and/or any other source of electrical power. Power source 150 and reference node 195 may form the positive and negative rails of a differential bus. In some examples, power source 150 includes an automotive battery configured to provide 48-volt power.

Power switch 160 can be configured to conduct electricity between power source 150 and load 190 based on a driver signal received at node 162. When power switch 160 turns on, power source 150 can provide electrical power to conductor 170 and load 190. When power switch 160 turns off, power source 150 is electrically disconnected from conductor 170 and load 190. However, a nonzero leakage current may flow through power switch 160 when power switch 160 is turned off. Power switch 160 may comprise, but is not limited to, any type of field-effect transistor (FET), a bipolar junction transistor (BJT), an insulated-gate bipolar transistor (IGBT), a high-electron-mobility transistor (HEMT), and/or another element that uses voltage for its control. Power switch 160 may include an n-type transistor and/or a p-type transistor. Power switch 160 may include elements such as silicon, silicon carbide, and/or gallium nitride. In some examples, power switch 160 includes a freewheeling diode connected in parallel with a transistor to prevent reverse breakdown of the transistor. System 140 does not necessarily include power switch 160 in all examples because power source 150 can be connected to conductor 170 and load 190 without a power switch.

Conductor 170 allows for the transmission of electrical power between power source 150 and load 190. Conductor 170 can include a metal wire, a metal layer, a trace in a circuit board, solder, and/or any other conductive element. Conductor 170 may include a material such as copper, gold, silver, aluminum, lead, tin, and/or any other conductive material. In some examples, conductor 170 directly connects power source 150 and load 190 without power switch 160. Conductor 170 may include a wire harness for carrying multiple wires, such as a first wire for connecting power source 150 and load 190 and a second wire to serve as a return path for reference node 195.

Load 190 may include a resistive load, a capacitive load, and/or an inductive load. Examples of inductive loads may include actuators, motors, and pumps used in one or more of heating, air condition, water supply, a fan, or other systems that include inductive loads. Examples of capacitive loads may include lighting elements, such as a Xenon arc lamp. In yet other examples, loads may be combinations of resistive, inductive and capacitive loads.

Electric arc 175 can occur on conductor 170, generating very high temperatures, which can damage nearby components such as wire isolation. Electric arc 175 can also cause an electrical short circuit between adjacent wires. Electric arc 175 can deplete the energy stored at power source 150 and can cause a fire hazard. Electric arc 175 can be sustained for distances up to thirteen millimeters, which is much longer than the interruption distance of standard relays. Electric arc 175 may go undetected unless system 140 includes a means for detecting electric arc 175. However, some techniques for detecting electric arc 175 add weight, cost, and failure points to system 140.

In accordance with the techniques of this disclosure, post-processing 130 analyzes the frequency spectrum of the received signal using bandpass filters 110. Bandpass filters 110 can be applied as a single filter with a passband that can shift along the frequency spectrum or with multiple filters, whose passbands do not change. Bandpass filters 110 perform selectively filtering of the current flowing to load 190. Peak detectors 120, which can be also adaptive, receive the filtered signal(s) and may be configured to detect peaks and threshold crossings. Post-processing 130 may be configured to determine whether electric arc 175 has occurred based on the crossing of the thresholds for a certain time and the ratios between the detected peaks. In some examples, post-processing 130 is configured to analyze the current flowing towards a single load 170, rather than multiple currents flowing towards multiple loads, in order to avoid frequency overlaps coming from other loads. Post-processing 130 looks for a frequency signature of electric arc 175 in the signal received at node 102.

Device 100 may include node 102 for receiving a signal indicating a current through conductor 170 to load 190. Node 102 receives the signal from sensing element 180, which include a shunt resistor, a current sensing transistor, a magnetoresistive element, and/or any other current sensor. In some examples, node 102 includes two or more nodes that receive a differential signal such as the voltage across a shunt resistor.

Device 100 may also include bandpass filters 110 for filtering the signal received at node 102. Each of bandpass filters 110 can include a distinct frequency range. When applied to the received signal one of bandpass filters 110 produces an output signal representing the magnitude of the received signal in the respective frequency range. Peak detectors 120 can detect the peak or threshold crossing of the output signal produced by each of bandpass filters 110. Peak detector 120 may be configured to output an indication of the magnitude of each of the received in the frequency ranges of bandpass filters 110.

Post-processing 130 can determine that electric arc 170 has occurred on conductor 170 based on a first magnitude of the received signal in a first frequency range and based on a second magnitude of the received signal in a second frequency range. Post-processing 130 can determine that electric arc 175 has occurred by determining that the first and second magnitudes exhibit or match a predefined mathematical relationship. In some examples, the predefined mathematical relationship may correspond to a signature that is associated with the electromagnetic noise produced by electric arc 175. In some examples, the arc current may be random in nature with a wide spectrum and varying peaks and uncorrelated frequencies that change in time. Post-processing 130 may be configured to perform a frequency analysis to determine the frequency spectrum and then decide if electric arc 175 is occurring towards load 190.

Although this disclosure describes device 100 as determining whether electric arc 175 "has occurred," device 100 may be configured to determine whether electric arc 175 is currently occurring and/or has previously occurred. Electric arc 175 may occur for a very short period of time on the order of microseconds or milliseconds. The determination of whether electric arc 175 is occurring by device 100 may take on the order of milliseconds. Therefore, by the time that device 100 completes the determination, electric arc 175 may still be occurring, or electric arc 175 may have ended and may no longer be occurring. Although electric arc 175 is shown occurring on conductor 170 between power switch 160 and sensing element 180, electric arc 175 can occur at other locations such as on conductor 170 between sensing element 180 and load 190, on conductor 170 near load 190, and/or on conductor 170 near at power switch 160.

Using bandpass filters 110 to filter the signal at sensing element 180 to determine that electric arc 175 has occurred allows the use of a less expensive, "dumb" load 190. A dumb load may not have intelligent current and voltage sensing or a transceiver for communicating the current and voltage values back to device 100 or to a microcontroller. System 140 may also require fewer wire harnesses than a system using another technique for detecting an electric arc, which makes system 140 cheaper, lighter (e.g., less metal but more plastic), and have fewer failure points. For example, system 140 may use less copper than a system with a load that communicates voltage and current information back to device 100 or to a microcontroller.

In addition, system 140 can include a microcontroller (not shown in FIG. 1) that has lower performance specifications (e.g., less powerful), is smaller, is cheaper, and has fewer pins. The microcontroller may be configured to not constantly monitor the parameters of load 190 because device 100 performs arc detection. The techniques of this disclosure can allow for decentralized evaluation and simplification of wire harnesses in system 140. Thus, device 100 may provide substantial value to system 140.

Figure 2:
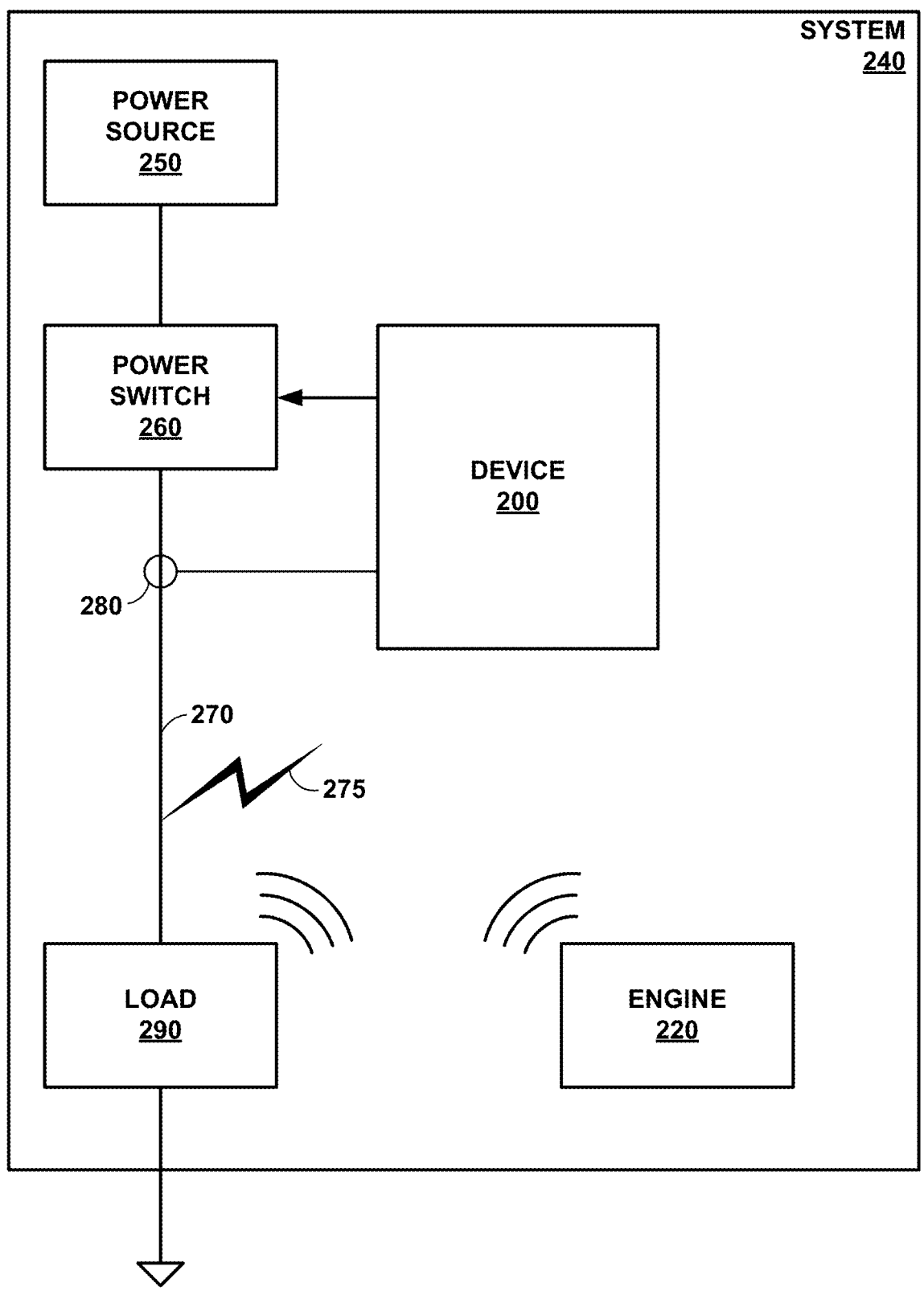
FIG. 2 is a conceptual block diagram of a system including a load and an engine, in accordance with some examples of this disclosure.

FIG. 2 is a conceptual block diagram of a system 240 including a load 290 and an engine 220, in accordance with some examples of this disclosure. System 240 is an example of system 100 shown in FIG. 1. Device 200 is configured to receive a signal indicating the current through conductor 270 to load 290 via sensing element 280. In the example shown in FIG. 2, device 200 is also configured to control the operation of power switch 260 by turning power switch 260 on and off to connect and disconnect power source 250 from load 290. For example, device 200 may include a microcontroller for generating a control signal (e.g., a pulse-width modulation signal) for power switch 260. Additionally or alternatively, device 200 may include a gate driver for generating and delivering a driving signal to the control terminal of power switch 260. Device 200 may include a high-side gate driver for power switch 260 such as battery switches, load connect-disconnects, and electronic fuses.

In some examples, device 200 may be part of a fuse-replacement product. In some examples device 200 may be a stand-alone unit that can be used with other electrical devices that connect to a load, and in other examples, device 200 may comprise a component of a larger electrical device. In various examples, there may be a separate power switch and/or conductor for each load in a system. Thus, there may be one of device 200 for each load and each power switch in the system. Although device 200 may be especially useful for 48-volt automotive systems, device 200 can also be used in 12-volt or 24-volt automotive systems, as well as non-automotive electrical power systems.

System 240 includes engine 220 and load 290, each of which may emit electromagnetic noise. The electromagnetic noise emitted by engine 220 may have a unique signature or frequency spectrum, and the electromagnetic noise emitted by load 290 may have a unique signature or frequency spectrum that is different than the unique signature or frequency spectrum produced by engine 220. During normal operation, engine 220 and/or load 290 can generate a well-defined spectrum in the current consumption with a high peak at the fundamental frequency and subsequent harmonics. Device 200 can detect turn-ons and turn-offs by detecting a one-time large variation of the current consumption. Device 200 can also detect ringing after turn-off because the oscillation frequency based on predefined inductive, capacitive, and resistive parasitics, which will generate a damped, (almost) single-frequency oscillation.

Device 200 may be configured to determine a level of electromagnetic noise injected by load 290 and/or engine 220 in the current travelling through conductor 270. Device 200 can use a bandpass filter in a frequency range that includes the noise injected by load 290 and/or engine 220. Device 200 can apply the bandpass filter to the signal received by device 200 from sensing element 280 to determine the level of noise injected by load 290 and/or engine 220. By determining the magnitude of the noise injected by load 290 and/or engine 220, device 200 can better determine whether electric arc 275 has occurred.

Figure 3:
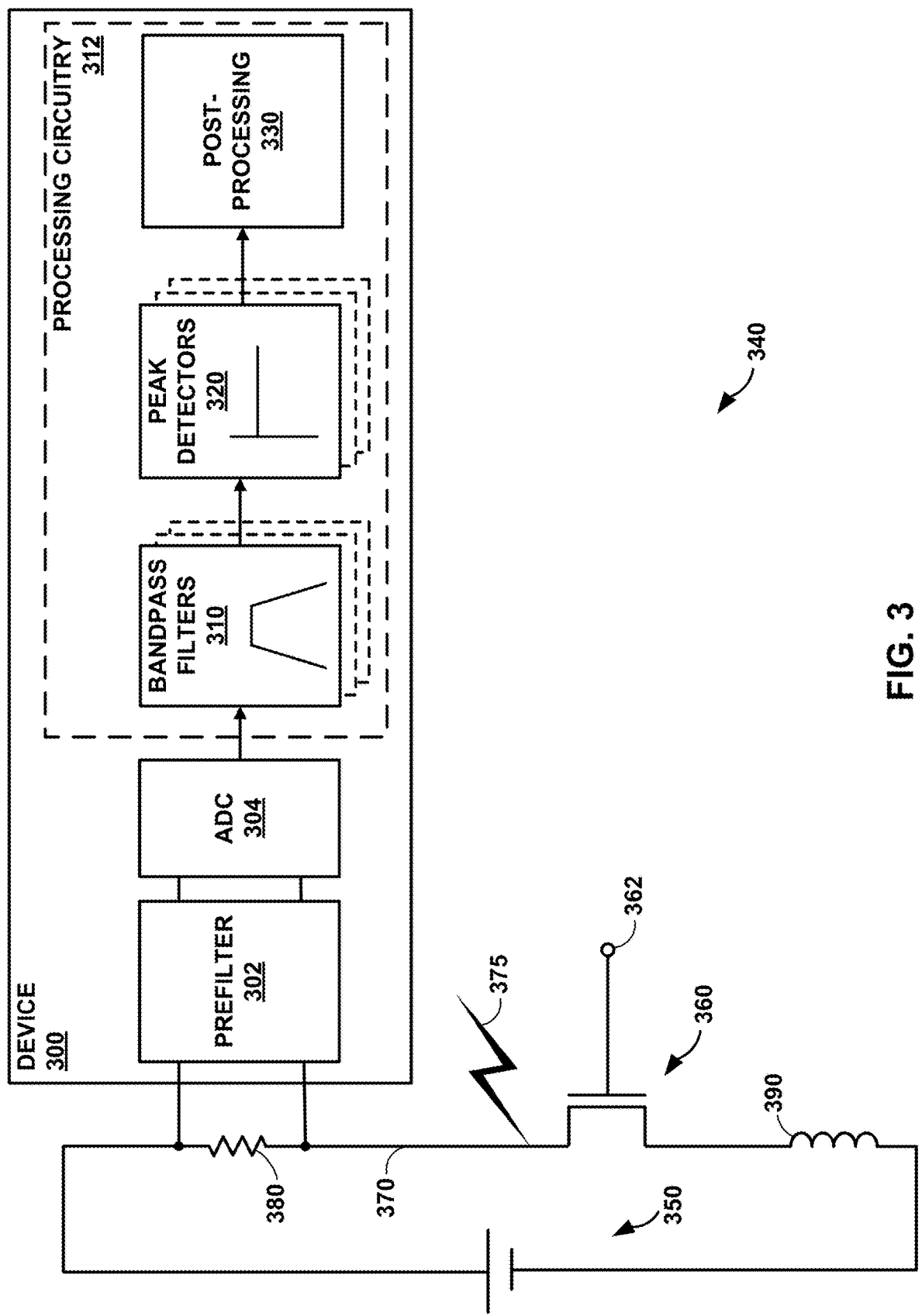
FIG. 3 is a conceptual block diagram of a device includes an analog-to-digital converter and processing circuitry, in accordance with some examples of this disclosure.

FIG. 3 is a conceptual block diagram of a device 300 includes an analog-to-digital converter (ADC) 304 and processing circuitry 312, in accordance with some examples of this disclosure. Device 300 is a digital implementation of device 100, where processing circuitry 312 includes digital logic for determining the magnitudes of a received signal. In some examples, a device can include analog circuitry (bandpass filters and peak detectors) for determining the magnitudes of a received signal.

In the example shown in FIG. 3, device 300 receives a differential signal at two nodes. The differential signal (e.g., the difference between two signals) may indicate the voltage across shunt resistor 380, which indicates the current through conductor 370. The differential signal is an example of the signal received by device 100 at node 102 from sensing element 180. Shunt resistor 380 is an example of a sensing element from which device 300 receives a signal indicating the current through conductor 370. Similar to system 100, system 300 includes power source 350 for delivering electrical power to load 390 through power switch 360, which operates based on a signal received at node 362.

Prefilter 302 may be configured to low-pass filter the received signal. Prefilter 302 can define the low-pass input filter for ADC 304, e.g., removing high-frequency noise from the received signal. Prefilter 302 can have a cutoff frequency that is higher than the frequency ranges of at least two of the bandpass filters 310. Prefilter 302 may also have a cutoff frequency that is higher than the sampling rate of ADC 304. In some examples, device 300 is configured to apply prefilter 302 as part of an integrated high- and low-pass filter. ADC 304 receives the pre-filtered signal, or an unfiltered signal in some examples, and converts the signal into a digital number. ADC 304 generates a series of digital numbers over time that represents the amplitude of the signal over time.

Processing circuitry 312 may be a part of the digital core of device 300. Processing circuitry 312 may apply bandpass filters 310 to the series of digital numbers output by ADC 304. In the example shown in FIG. 3, each of bandpass filters 310 is a digital filter implemented by processing circuitry 312. For example, device 300 may include a set of instructions that, when executed, cause processing circuitry 312 apply each of bandpass filters 310 to the series of digital numbers to determine a magnitude in a respective frequency range. In some examples, processing circuitry 312 can apply one or more of bandpass filters 310 by independently applying a low-pass filter (e.g., prefilter 302) and a high-pass filter to the received signal or to the series of digital numbers. Device 300 can apply prefilter 302 as a single low-pass filter (e.g., an analog filter) and apply each of bandpass filters 310 as a high-pass filter, either as separate high-pass filters or as a single moving high-pass filter. As a result, each of the high-pass filters can share a single low-pass filter. As an alternative, device 300 can also apply prefilter 302 as multiple separate low-pass filters. Thus, processing circuitry 312 may be configured to apply bandpass filters 310 as high-pass filters in some examples.

Processing circuitry 312 can use peak detectors 320 to determine the magnitude of the output of each of bandpass filters 310. Peak detectors 320 can determine the peak amplitude of a signal or a series of digital number. Additionally or alternatively, peak detectors 320 can determine the whether a magnitude crosses, exceeds, or is greater than a threshold value. In some examples, peak detectors 320 may include a root-mean-square (RMS) detector, a quasi-RMS detector, and/or an average detector.

Post-processing 330 is configured to determine whether electric arc 375 has occurred based on the outputs of bandpass filters 310 and peak detectors 320. For example, post-processing 330 can determine that electric arc 375 has occurred by determining that the magnitudes output by bandpass filters 310 and peak detectors 320 exhibit a predetermined mathematical relationship. Post-processing 330 can calculate the ratio(s) or relationship(s) of the magnitudes or peaks at different frequencies and then check if the ratio(s) match the predetermined mathematical relationship. The predetermined mathematical relationship may include an inverse-frequency relationship or any other relationship where the magnitude declines as frequency increases. Electric arc 375 may produce electromagnetic noise with a signature that is proportional to $1/f$, $1/(f^N)$, or any other relationship, where f is frequency and N is any constant. Thus, device 300 may be configured to measure the current through conductor 370, digitize the signal using ADC 304, bandpass filter the digitized output, confirm the occurrence of electric arc 375 if the detected magnitudes in the different filtering windows (e.g., frequency ranges) show the blueprint of a 1/f noise signal (e.g., an inverse-frequency relationship).

Post-processing 330 may be configured to determine parameters and characteristics of electric arc 375 based on the received signal and analyzing the magnitude outputted by bandpass filters 310. For example, post-processing 330 may be able to determine the duration and/or size of electric arc 375. The size refers to the voltage dropped by electric arc 375, the electrical current flowing through electric arc 375, or the distance spanned by electric arc 375. Post-processing 330 may also be able to determine the type of electric arc 375 (e.g., parallel or serial) and/or the cause of electric arc 375. In some examples, post-processing 330 is configured to distinguish the cause of electric arc 375 from other causes.

FIGS. 4A-4E are graphs showing example bandpass filters, in accordance with some examples of this disclosure. The vertical axes of the graphs shown in FIGS. 4A-4E represent noise density, which may be expressed in units of volts-squared divided by hertz. The horizontal axes of the graphs shown in FIGS. 4A-4E represent frequency, which may be expressed in units of hertz. The axes of the graphs use a logarithmic scale to show frequencies between less than one hertz to more than one hundred thousand hertz.

Figure 4A:
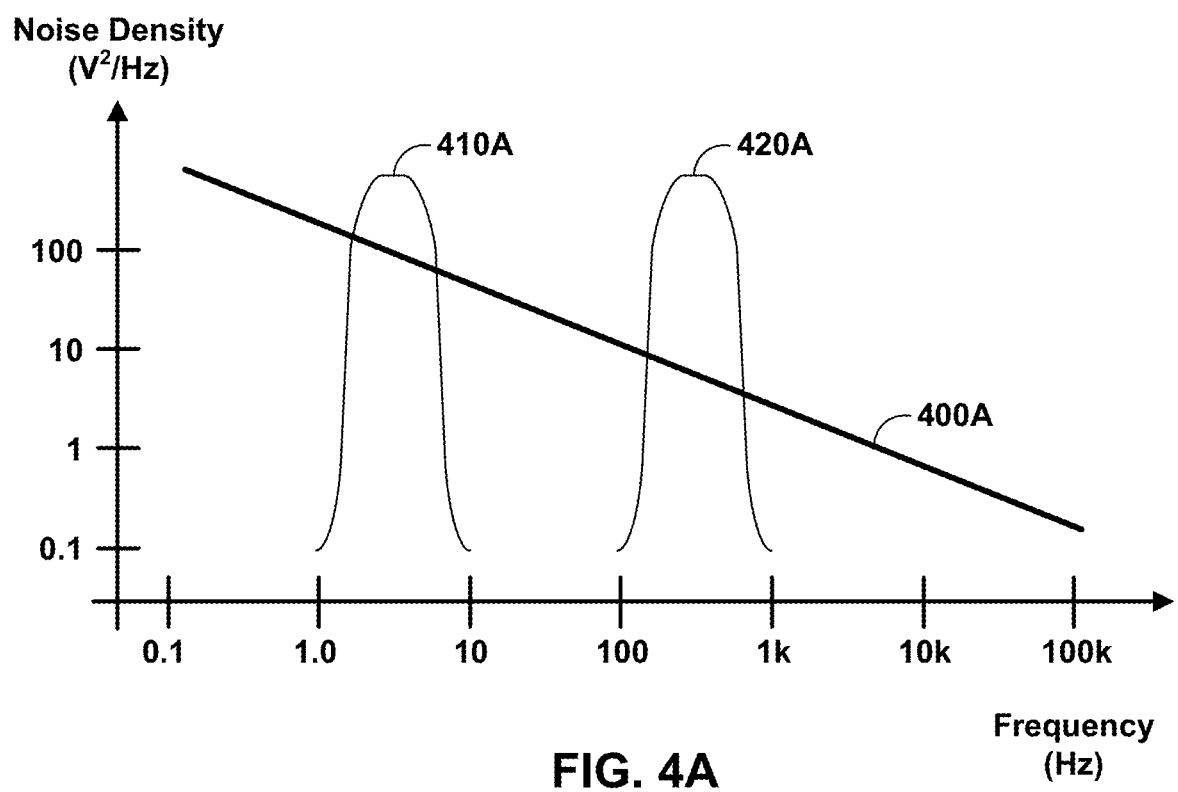
FIGS. 4A-4E are graphs showing example bandpass filters, in accordance with some examples of this disclosure.

FIG. 4A shows an example with two bandpass filters. A device can use two bandpass filters 410A and 420A where the parameters (e.g., the slope) of a mathematical relationship are known and where there are no other disturbances or components generating noise. Slope 400A represents the predetermined mathematical relationship, which is a spectral blueprint of an electric arc. In the example shown in FIG. 4A, bandpass filter 410A covers a frequency range of one to ten hertz, and bandpass filter 420A covers a frequency range of one hundred hertz and one kilohertz. The device can determine the ratio of the magnitudes of the signal in each frequency range.

The frequency ranges of bandpass filters 410A and 420A can be selected or defined so as to not overlap with the fundamental frequencies injected by loads or other nearby components such as an engine. The frequency ranges of bandpass filters 410A and 420A can be selected to not overlap with the switching frequency of a power switch. The frequency ranges of bandpass filters 410A and 420A can be selected below a level at which the steady-state noise drowns out the electromagnetic noise produced by an electric arc. The steady-state noise may be white noise with roughly equal magnitudes at all frequencies. Thus, at high frequencies where the noise produced by the electric arc is lower, the steady-state noise may overwhelm the noise produced by the electric arc. Above ten, twenty, or thirty kilohertz, the signal produced by an electric arc may be indistinguishable from noise produced by other sources.

Figure 4B:
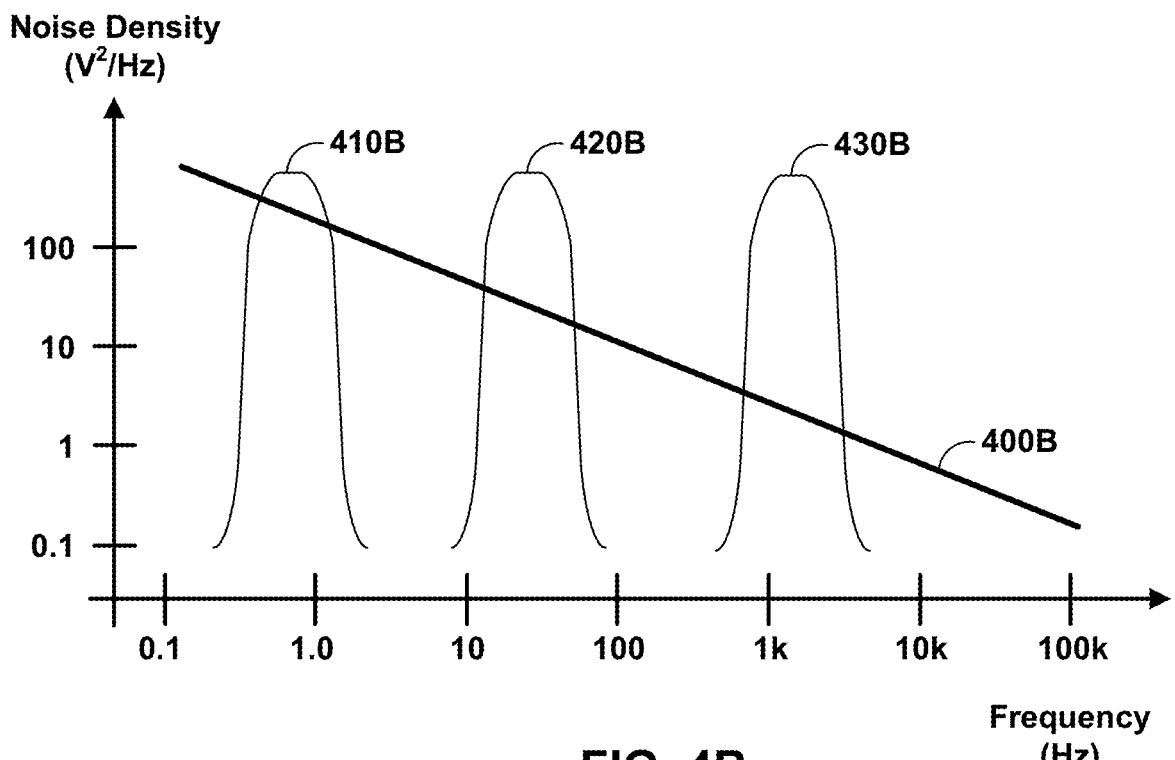
Figure 4C:
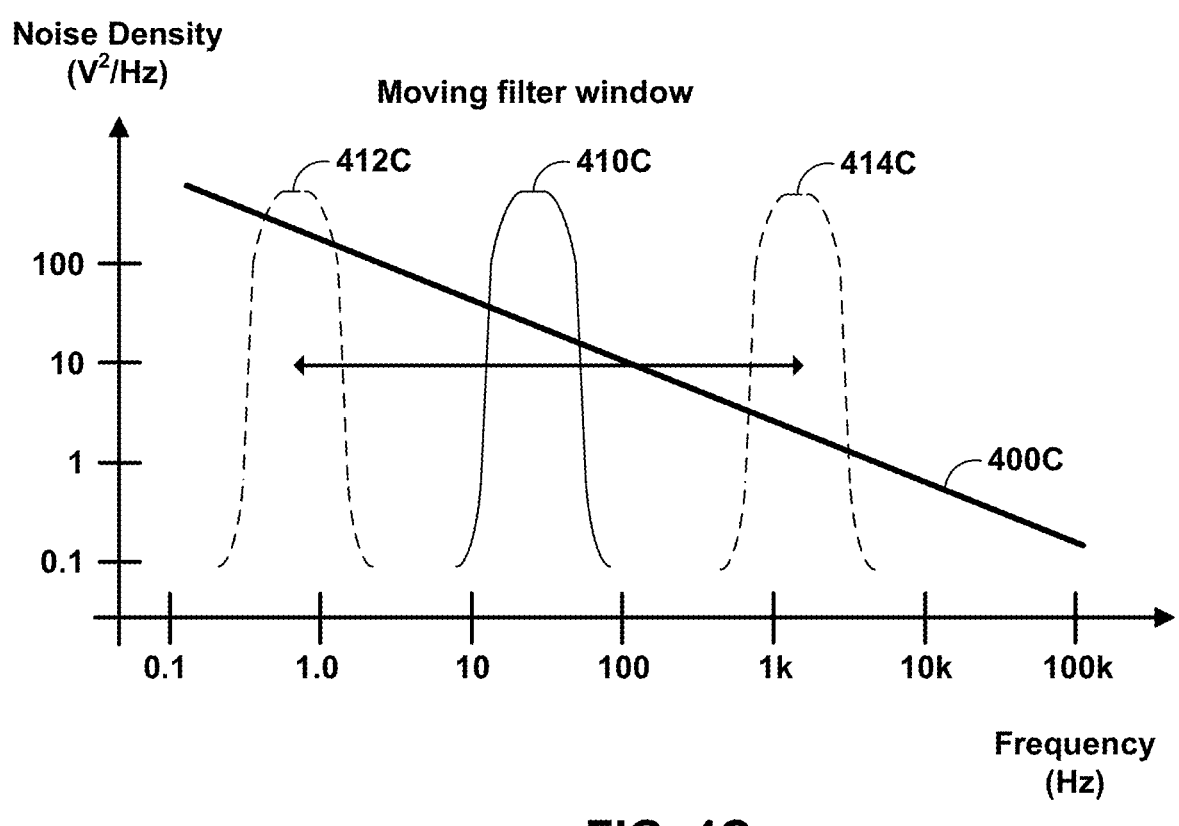

FIGS. 4B and 4C show examples with three bandpass filters. A device can use a third bandpass filter where at least one parameter of a predetermined mathematical relationship is not known to confirm that an electric arc has occurred, if there are no disturbances. The device can use the magnitudes detected by two (or more) filters to determine the unknown parameter(s). In some examples, the device uses two filters to determine the unknown parameter(s) and the mathematical relationship. The device can then confirm the mathematical relationship by determining whether a third magnitude from a third bandpass filter aligns with the previously calculated mathematical relationship, within an allowable tolerance. Alternatively, a device can use a third bandpass filter where the parameters of the predetermined mathematical relationship are known to determine a level of steady-state noise. The device can select a frequency range greater than five, ten, twenty, one hundred, or two hundred kilohertz to detect the level of steady-state noise because at high frequencies the noise may be mostly steady-state, rather than produced by an electric arc or a load. For example, the center frequency of a bandpass filter may be set to two hundred kilohertz to measure the level of the steady-state noise.

In some examples, bandpass filters 410B, 420B, 430B can be implemented as separate filters. In contrast, bandpass filters 410C, 412C, 414C can be implemented as a single moving filter that can change its frequency range and center frequency. For example, a device can apply the single moving bandpass filter as bandpass filter 410C at a first time, as bandpass filter 412C at a second time, and as bandpass filter 414C at a third time. The device can move the single bandpass filter along the spectral distribution of the noise produced by the electric arc. In some examples, a device can apply multiple bandpass filters using at least one moving bandpass filter and at least one fixed bandpass filter, where the fixed filter is separate from the moving filter. Thus, a device can use at least one fixed bandpass filter with a fixed frequency range and at least one moving bandpass filter that can be applied across multiple frequency ranges. A moving filter may be useful in determining a level of background noise or steady-state noise. A fixed bandpass filter includes a fixed frequency range that does not move such that the device cannot apply the fixed bandpass filter in multiple frequency ranges.

Bandpass filters 410B, 420B, 430B may be easier to design, build, and operate, as compared to the single moving bandpass filter that can be applied as bandpass filters 410C, 412C, 414C. However, bandpass filters 410B, 420B, 430B may take up more chip space than the single moving bandpass filter. The single moving bandpass filter may be more difficult to build and operate, but the single moving bandpass filter can take up less chip space than bandpass filters 410B, 420B, 430B. Either the separate bandpass filters or the single moving bandpass filter can be implemented as analog filters, digital filters, software filters, and/or hardware filters.

Figure 4D:
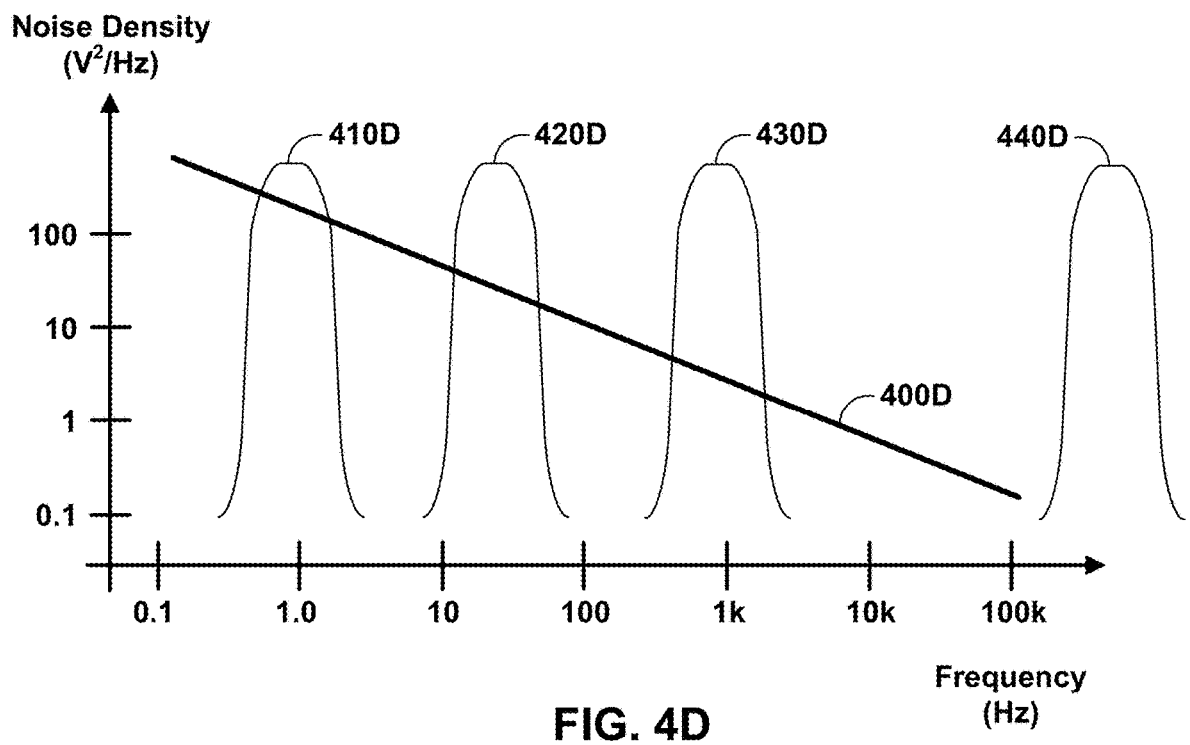

FIG. 4D shows an example with four bandpass filters. A device can use a fourth bandpass filter where at least one parameter of a predetermined mathematical relationship is not known to determine a level of steady-state noise at a high frequency range. Alternatively, a device can use a fourth bandpass filter where the parameters of the predetermined mathematical relationship are known to determine a level of noise injected by a load or another component. The center frequency of the fourth bandpass filter can be selected at a generated high peak from a component that is attached or proximate the device.

Figure 4E:
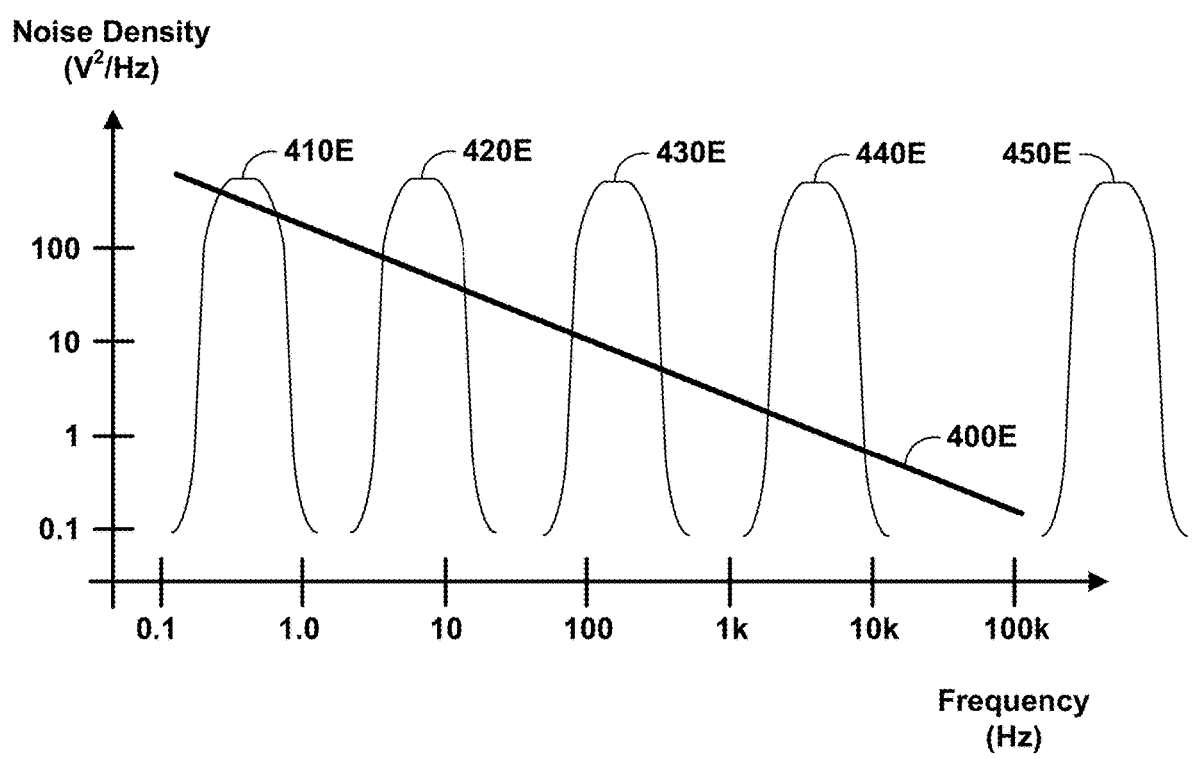

FIG. 4E shows an example with five bandpass filters. A device can use a fifth bandpass filter where at least one parameter of a predetermined mathematical relationship is not known to perform a plausibility check by determining a level of noise injected by a load or another component. The number, order, and purpose of the filters described herein can be changed. For example, a device can use a third bandpass filter to determine the noise injected by a load, or a device can use a fifth bandpass filter to confirm that the electric arc has occurred. In addition, a device can use more than five bandpass filters in some examples. A device can also use more than one bandpass filter for any of the purposes described herein, such as three or more bandpass filters to confirm the occurrence of an electric arc, two or more bandpass filters to detect steady-state noise or two or more bandpass filters to noise injected by a load. Additional bandpass filters can be used to tune to a specific type of arc detection.

Figure 5:
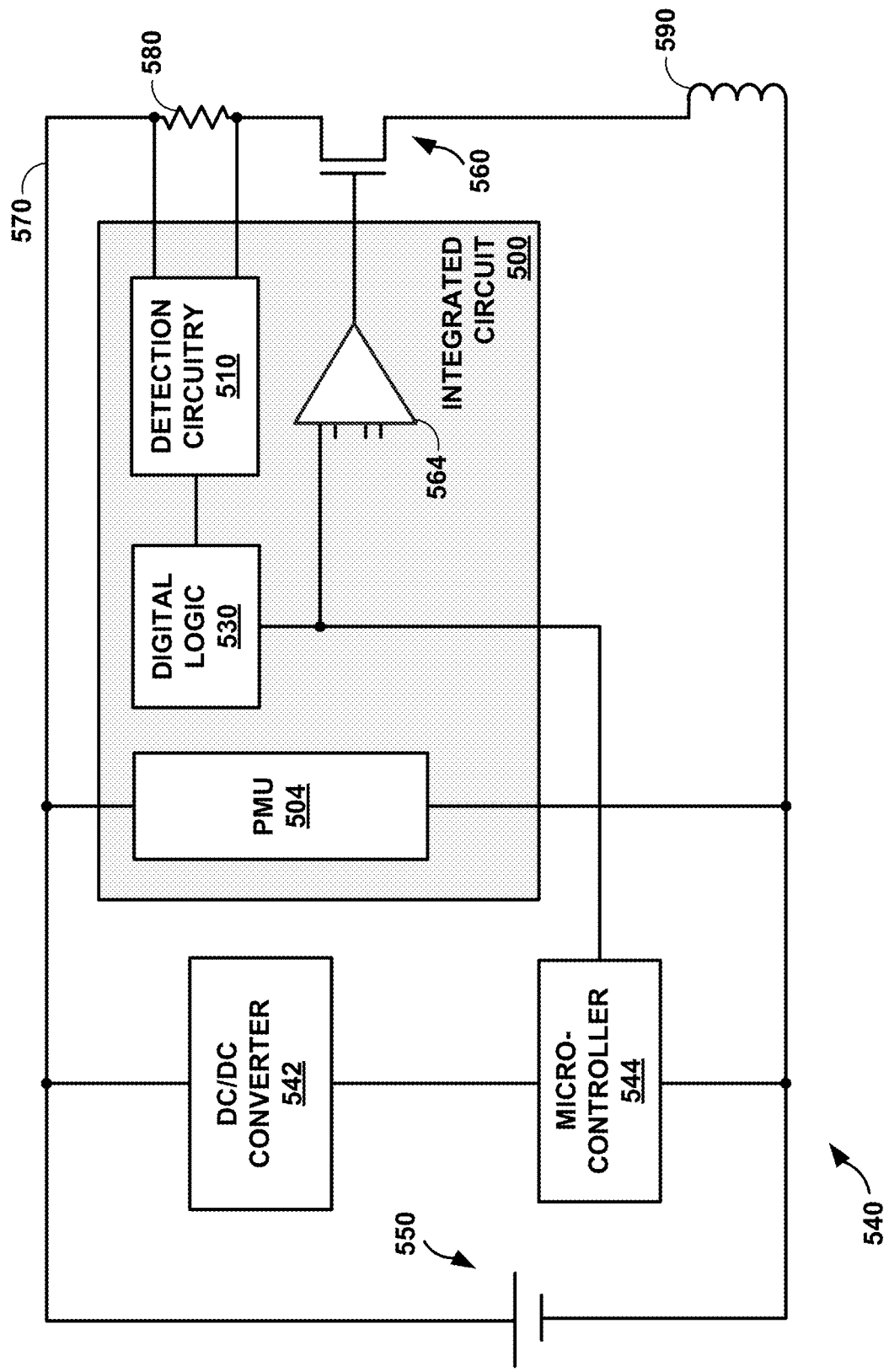
FIG. 5 is a conceptual block diagram of a system including a gate driver and a microcontroller, in accordance with some examples of this disclosure.

FIG. 5 is a conceptual block diagram of a system 540 including a gate driver 564 and a microcontroller 544, in accordance with some examples of this disclosure. System 500 also includes integrated circuit 500, direct-current/direct-current (DC/DC) converter 542, power source 550, power switch 560, conductor 570, shunt resistor 580, and load 590. Integrated circuit 500 includes power management unit (PMU) 504, detection circuitry 510, digital logic 530, and gate driver 564. Integrated circuit 500 is an example of devices 100, 200, and 300 shown in FIGS. 1-3. Integrated circuit 500 may offer high-voltage capability and high circuit density for digital integration.

PMU 504 receives power from power source 550 and provides power to detection circuitry 510, digital logic 530, and gate driver 564. PMU 504 may include a power converter to generate power for each of the components of integrated circuit 500. Integrated circuit 500 may include a charge pump and/or boost converter, as part of PMU 504 or gate driver 564, for generating a voltage higher than power source 550. Gate driver 564 can use the higher voltage level to drive power switch 560 to turn on and off power switch 560 to connect and disconnect power source 550 and load 590.

Detection circuitry 510 can include an ADC that measures and digitizes the voltage drop on shunt resistor 580, which may be connected in series in the current supply path of load 590 between power source 550 and power switch 560. Shunt resistor 580 should be positioned so that shunt resistor 580 does not experience influence from loads other than load 590. For example, if shunt resistor 580 is positioned between the power distribution point of power source 550 (e.g., after the battery switch) and the drain of power switch 560. Digital logic 530 may be part of the digital core of integrated circuit 500 and can analyze the information provided by detection circuitry 510 (e.g., the ADC and/or filters) by performing a spectrum analysis.

Digital logic 530 also has a communication interface with microcontroller 544, which receives power supply from DC/DC converter 542. Digital logic 530 can communicate or report the detection of an electric arc to microcontroller 544. Digital logic 530 may be configured to communicate the type of electric arc to microcontroller 544, as well as other determined parameters or characteristics of the electric arc, such the length of time and the size of the electric arc.

Although FIG. 5 is described as a digital implementation, analog implementations are also possible. Analog filters take up larger chip area than digital filtering, especially for low-frequency filtering. Moreover, analog filters are more difficult to configure than digital filters, especially for implementations including a single moving filter. Configuring a digital filter may involve changing the coefficients of the filter, as compared to changing the inductance or capacitance of an analog filter. Moreover, a digital implementation allows for the digitized current information generated by digital logic 530 to be used for other purposes in integrated circuit 500, such as overcurrent protection.

During the operation of system 540 and integrated circuit 500, gate driver 564 turns on power switch 560. The ADC in detection circuitry 510 measures the current flowing through shunt resistor 580 and digitizes the information. Digital logic 530 performs the filtering and peak detection. Based on the decisions of the peak detectors and by looking at the ratios between the filtered amplitudes, digital logic 530 decides if an electric arc is taking place on conductor 570 (e.g., in the wire harness holding conductor 570). Digital logic 530 determines that an electric arc has occurred based on the fundamental frequency, the harmonics, the amplitudes of the fundamental frequency and the harmonics, and the history of the previous analysis. If digital logic 530 detects an electric arc, integrated circuit 500 can decide whether to shut down power switch 560 immediately and notify microcontroller 544. Additionally or alternatively, digital logic 530 can limit the current on conductor 570 and notify microcontroller 544, or digital logic 530 can just notify microcontroller 544 and wait for microcontroller 544 to decide whether to turn off power switch 560 and disconnect load 590.

Other implementations of the detection mechanism are possible, which do not involve a full frequency analysis. For example, if the frequency spectrum of load 590 is known and also the expected ripple frequencies after turn-off are known, digital logic 530 and/or detection circuitry 510 can apply filters to remove these frequencies from the analyzed signal. Then digital logic 530 and/or detection circuitry 510 can analyze the remaining signal using peak detectors. Integrated circuit 500 can implement the filters in either the analog or digital domain. Unfortunately, this technique can pose limitations over the type of loads that can be driven by power switch 560. This technique also assume that there is additional knowledge about the occurring frequencies. However, this technique could also lead to a smaller and simpler integrated circuit 500.

Figure 6:
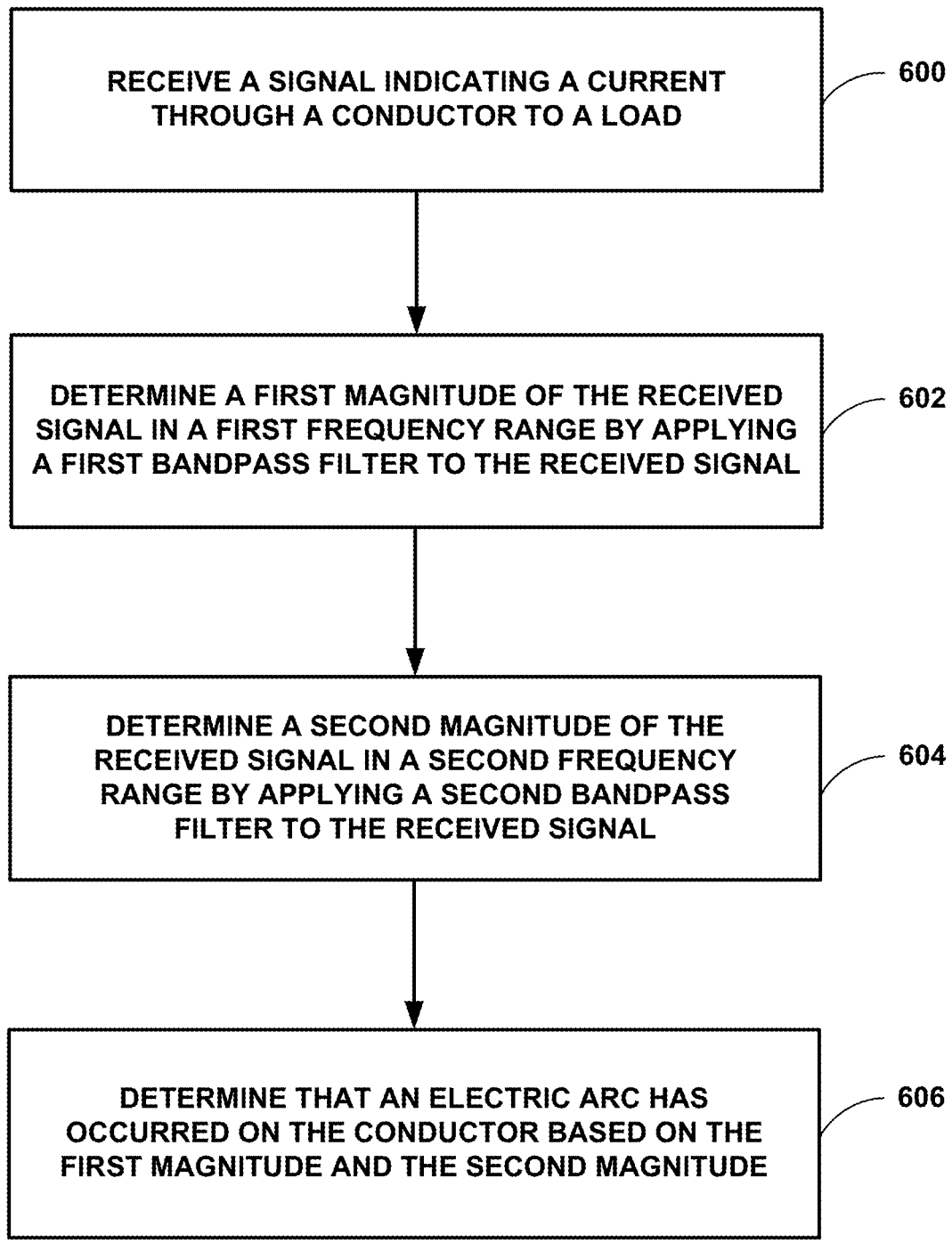
FIG. 6 is a flow diagram illustrating example techniques for determining that an electric arc has occurred on a conductor, in accordance with some examples of this disclosure.

FIG. 6 is a flow diagram illustrating example techniques for determining that an electric arc has occurred on a conductor, in accordance with some examples of this disclosure. The techniques of FIG. 6 are described with reference to system 140 shown in FIG. 1, although other components may exemplify similar techniques.

In the example of FIG. 6, node 102 receives a signal indicating a current through conductor 170 to load 190 (600). Device 100 receives the signal at node 102 from sensing element 180, which may include a shunt or series resistive and/or capacitive element, a current mirror, a current sensing transistor, a magnetoresistive sensor, and/or any other current sensor. In some examples, the received signal is a differential signal that represents the voltage across sensing element 180.

In the example of FIG. 6, device 100 determines a first magnitude of the received signal in a first frequency range by applying a first one of bandpass filters 110 (602). Device 100 also determines a second magnitude of the received signal in a second frequency range by applying a second one of bandpass filters 110 (604). Device 100 can apply bandpass filters 110 as separate filters or as a single moving filter that can be independently applied as a first bandpass filter and as a second bandpass filter. Device 100 can also apply more than two bandpass filters 110 to confirm whether electric arc 175 has occurred, to determine the parameter(s) of the mathematical relationship between the magnitudes, detect the level of steady-state noise in system 100, and/or detect a level of noise produced by load 190.

In the example of FIG. 6, post-processing 130 determines that electric arc 175 has occurred on conductor 170 based on the first and second magnitudes (606). Post-processing 130 may be configured to determine a ratio of the first and second magnitudes. Post-processing 130 can detect that electric arc 175 has occurred in response to determining that the ratio(s) of the magnitudes exhibits a predetermined mathematical relationship (e.g., a signature of electric arc 175).

Figure 7:
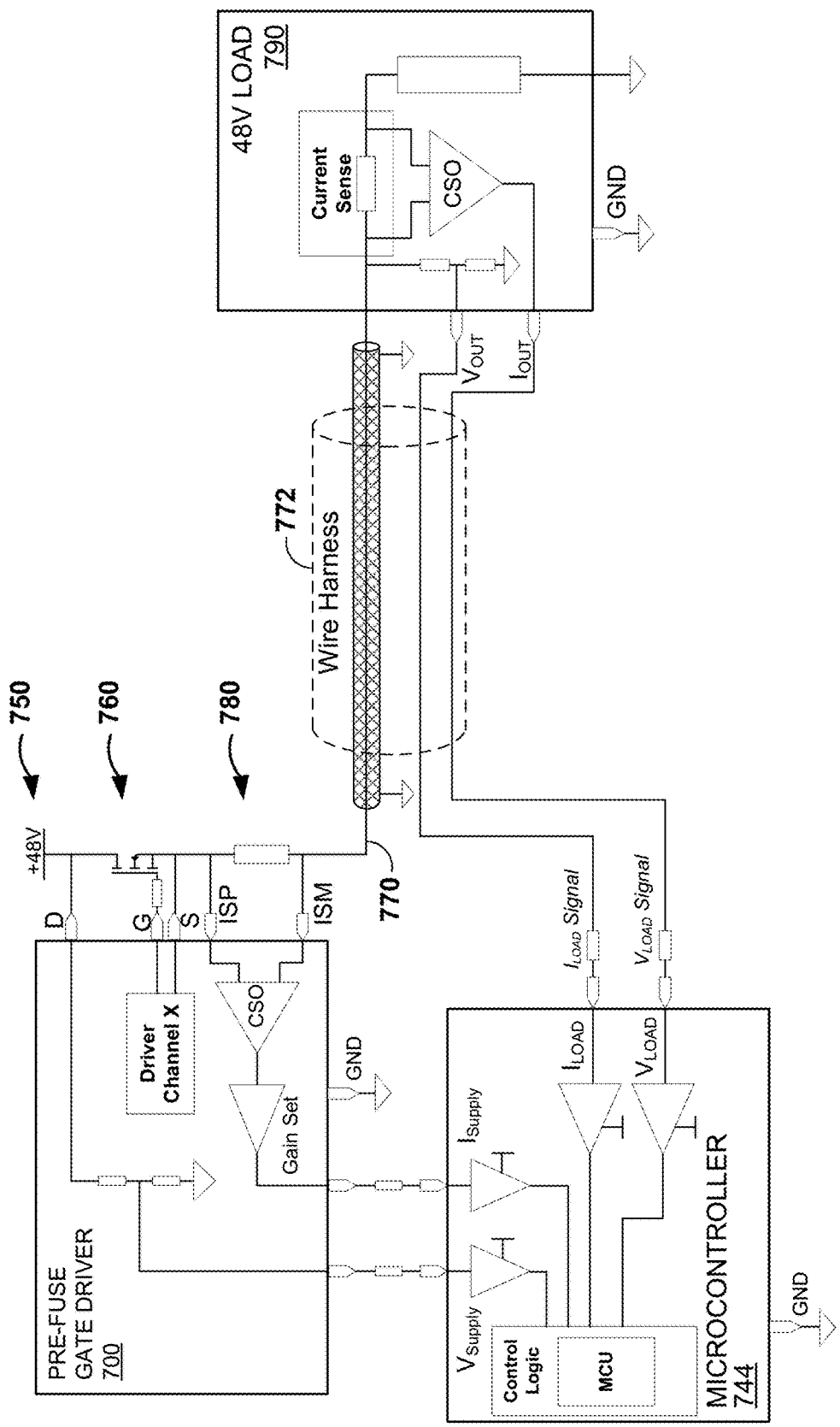
FIGS. 7 and 8 are conceptual block and circuit diagrams of systems including current sensing at the load, in accordance with some examples of this disclosure.
Figure 8:
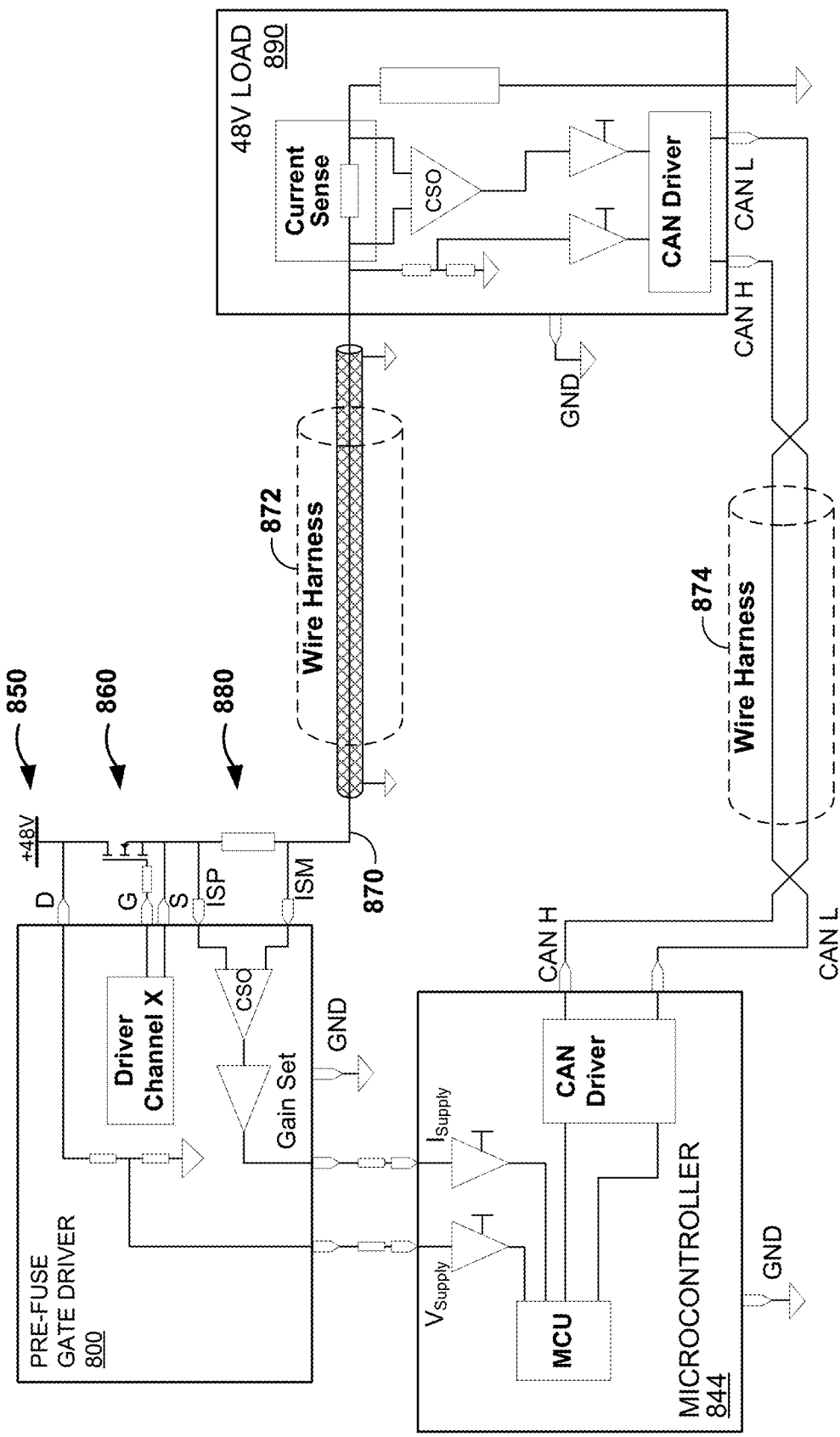

FIGS. 7 and 8 are conceptual block and circuit diagrams of systems 740 and 840 including current sensing at the load, in accordance with some examples of this disclosure. Although systems 740 and 840 are shown as 48-volt systems, systems 740 and 840 may also be configured to use a different voltage level, such as twelve voltages or twenty-four voltages. System 740 includes gate driver 700, microcontroller 744, battery 750, power switch 760, conductor 770, wire harness 772, shunt resistor 780, and load 790. System 840 includes gate driver 800, microcontroller 844, battery 850, power switch 860, conductor 870, wire harnesses 872 and 874, shunt resistor 880, and load 890.

In a 48V system such as systems 740 and 840, arc detection can be by simultaneously measuring and comparing the current and voltage at the output of batteries 750 and 850 and at the input of loads 790 and 890. System 740 is an example of instantaneous read-out of voltage and current at both the output of battery 750 and the input of load 790. This configuration ensures that the read-out is done simultaneously, which is important because the amplitude of a current through an arc has a large variation in time. The configuration of system 740 uses additional wires in wire harness 772 and an intelligent load 790, which can send the current and voltage information back to the analysis microcontroller 744. This configuration adds weight, cost and failure points to system 740.

In the example of system 740, the voltage and the current are physically sent back to microcontroller 744. Microcontroller 744 can quickly and easily trigger the comparison because gate driver 700 and load 790 send all of the parameters directly to the ADC of microcontroller 744. If the system 740 has many numerous loads, the wire harnesses can be complicated and more susceptible to short circuits, disconnections, and synchronization issues.

System 840 is an example of a multiplexed readout through a communication bus in wire harness 874. This configuration has the advantage that of fewer wires in wire harness 872, but system 840 uses smart load 890 with bus communication capability. System 840 may also experience information transfer delay, due to the time multiplexing, which can lead to false evaluations. Therefore, system 840 is potentially less accurate and still incurs the additional cost of smart load 890.

In the example of system 840, the voltage and the current are sent back to microcontroller 844 through a bus, such as a Controller Area Network (CAN) bus. Using separate wire harnesses 872 and 874 means that the wiring is relatively simple. However, microcontroller 844 may have difficulty synchronizing between battery 850 and load 890 because there may be a delay between load 890 and microcontroller 844. While load 890 can trigger acquisition through the CAN bus, microcontroller 844 deals with synchronization with direct conversion of the supply parameters. Communicating the parameters back through the CAN bus can result in a delay in the transmission of the load parameters.

Another method is to measure the current consumption in a conductor and apply a Fourier transform to determine the spectral components of the signal. The spectral footprint of an electric arc can show the behavior of the 1/f noise. However, applying a Fourier transform uses high computing power, which is available only in expensive high-end microcontrollers. Fourier analysis can involve high input bandwidth and high computing power in the microcontroller. For systems with a large number of 48-volt loads, this approach may be not cost-efficient.

Smart loads 790 and 890 are able to measure and communicate back the current and voltage at the load to gate drivers 700 and 800 and/or microcontrollers 744 and 844. Gate drivers 700 and 800 are capable of measuring the voltage and current sent to loads 790 and 890. Microcontrollers 744 and 844 can process and compare all information sent from gate drivers 700 and 800 and loads 790 and 890. In the event of no electric arc, then the voltage level of batteries 750 and 850 equals the voltage level received by loads 790 and 890 and the current produced by batteries 750 and 850 equals the current received by loads 790 and 890.

A first example of an electric arc that can occur in wire harnesses 772 and 872 is a parallel electric arc between a live wire and reference ground. The shielding of the wire may be grounded, so an electric arc can occur between the wire and the wire shielding. Faulty wire insulation can cause this type of electric arc. For this type of electric arc, the voltage level of batteries 750 and 850 may equal the voltage level received by loads 790 and 890, but the current produced by batteries 750 and 850 may be greater than the current received by loads 790 and 890 because of the current lost to the parallel electric arc. Given that the behavior of the electric arc can be unpredictable, microcontroller 744 should compare the parameters at the same moment.

A second example of an electric arc that can occur in wire harnesses 772 and 872 is a serial electric arc between two live wires. A broken cable or a loose contact can cause this type of electric arc. For this type of electric arc, the current produced by batteries 750 and 850 may be equal to the current received by loads 790 and 890, but the voltage level of batteries 750 and 850 may be greater than the voltage level received by loads 790 and 890, because of the voltage drop across the serial electric arc. However, the current comparison between battery and load may not balance if, for example, the impedance of electric arc changes over time.

The following numbered examples demonstrate one or more aspects of the disclosure.

Example 1

A device includes at least one input node configured to receive a signal indicating a current through a conductor to a load. The device also includes circuitry configured to determine a first magnitude of the received signal in a first frequency range by applying a first bandpass filter to the received signal. The circuitry is also configured to determine a second magnitude of the received signal in a second frequency range by applying a second bandpass filter to the received signal. The circuitry is further configured to determine that an electric arc has occurred on the conductor based on the first magnitude and the second magnitude.

Example 2

The device of example 1, wherein the circuitry is configured to determine that the electric arc has occurred on the conductor by determining that the first magnitude and the second magnitude exhibit a predetermined mathematical relationship.

Example 3

The device of examples 1-2 or any combination thereof, wherein the circuitry is configured to determine that the electric arc has occurred on the conductor by determining that a ratio of the first magnitude and the second magnitude exhibits an inverse-frequency relationship.

Example 4

The device of examples 1-3 or any combination thereof, wherein the circuitry is configured to apply the first bandpass filter and the second bandpass filter by applying a single moving bandpass filter.

Example 5

The device of examples 1-4 or any combination thereof, wherein the single moving bandpass filter is configured as the first bandpass filter at a first time and configured as the second bandpass filter at a second time.

Example 6

The device of examples 1-5 or any combination thereof, wherein the circuitry is configured to determine a third magnitude of the received signal in a third frequency range by applying a third bandpass filter to the received signal.

Example 7

The device of examples 1-6 or any combination thereof, wherein the circuitry is configured to confirm that the electric arc has occurred on the conductor based on the third magnitude when at least one parameter of a mathematical relationship for the electric arc is not known.

Example 8

The device of examples 1-7 or any combination thereof, wherein the circuitry is configured to determine the at least one parameter of the mathematical relationship.

Example 9

The device of examples 1-8 or any combination thereof, wherein the circuitry is configured to determine the at least one parameter of the mathematical relationship based on at least one of the magnitudes.

Example 10

The device of examples 1-9 or any combination thereof, wherein the circuitry is configured to determine a fourth magnitude of the received signal in a fourth frequency range by applying a fourth bandpass filter to the received signal.

Example 11

The device of examples 1-10 or any combination thereof, wherein the circuitry is configured to determine a level of steady-state noise based on the fourth magnitude.

Example 12

The device of examples 1-11 or any combination thereof, wherein the fourth frequency range is higher than the first, second, and third frequency ranges.

Example 13

The device of examples 1-12 or any combination thereof, wherein the circuitry is configured to determine a fifth magnitude of the received signal in a fifth frequency range by applying a fifth bandpass filter to the received signal.

Example 14

The device of examples 1-13 or any combination thereof, wherein the circuitry is configured to determine a level of noise injected by the load based on the fifth magnitude.

Example 15

The device of examples 1-14 or any combination thereof, wherein the circuitry is configured to determine a third magnitude of the received signal in a third frequency range by applying a third bandpass filter to the received signal.

Example 16

The device of examples 1-15 or any combination thereof, wherein the circuitry is configured to determine a level of steady-state noise based on the third magnitude when parameters of a mathematical relationship for the electric arc are known.

Example 17

The device of examples 1-16 or any combination thereof, wherein the circuitry is configured to determine a fourth magnitude of the received signal in a fourth frequency range by applying a fourth bandpass filter to the received signal.

Example 18

The device of examples 1-17 or any combination thereof, wherein the circuitry is configured to determine a level of noise injected by the load based on the fourth magnitude.

Example 19

The device of examples 1-18 or any combination thereof, wherein the circuitry is configured to determine a level of steady-state noise based on at least one of the magnitudes.

Example 20

The device of examples 1-19 or any combination thereof, wherein the circuitry is configured to determine a level of noise injected by the load based on the fifth magnitude.

Example 21

The device of examples 1-20 or any combination thereof, wherein the circuitry is configured to apply the first bandpass filter by independently applying a first low-pass filter and a first high-pass filter to the received signal.

Example 22

The device of examples 1-21 or any combination thereof, wherein the circuitry is configured to apply the second bandpass filter by independently applying a second low-pass filter and a second high-pass filter to the received signal.

Example 23

The device of examples 1-22 or any combination thereof, wherein the circuitry is configured to determine the first magnitude by applying the first bandpass filter to generate a first filtered signal and applying a first RMS detector, a first quasi-RMS detector, or a first average detector to the first filtered signal.

Example 24

The device of examples 1-23 or any combination thereof, wherein the circuitry is configured to determine the second magnitude by applying the second bandpass filter to generate a second filtered signal and applying a second RMS detector, a second quasi-RMS detector, or a second average detector to the second filtered signal.

Example 25

The device of examples 1-24 or any combination thereof, further including an ADC configured to convert the received signal to a series of digital numbers.

Example 26

The device of examples 1-25 or any combination thereof, wherein the circuitry is configured to determine the first magnitude in the first frequency range by applying the first bandpass filter to the series of digital numbers.

Example 27

The device of examples 1-26 or any combination thereof, wherein the circuitry is configured to determine the second magnitude in the second frequency range by applying the second bandpass filter to the series of digital numbers.

Example 28

The device of examples 1-27 or any combination thereof, wherein the signal indicates the current through a power switch and through the conductor to the load.

Example 29A

The device of examples 1-28 or any combination thereof, further including a gate driver configured to deliver a driving signal to the power switch to turn the power switch on or off.

Example 29B

The device of examples 1-29A or any combination thereof, wherein the circuitry is configured to apply at least one of the bandpass filters as a fixed bandpass filter with a fixed frequency range.

Example 29C

The device of examples 1-29B or any combination thereof, wherein the circuitry is configured to apply at least one of the bandpass filters as a moving bandpass filter that can be configured to with different frequency ranges at different times.

Example 29D

The device of examples 1-29C or any combination thereof, wherein the circuitry is configured to apply both a fixed bandpass filter and a moving bandpass filter to the received signal.

Example 30

A method includes receiving, by at least one node of a device, a signal indicating a current through a conductor to a load. The method also includes determining, by processing circuitry of the device, a first magnitude of the received signal in a first frequency range by applying a first bandpass filter to the received signal. The method further includes determining, by the processing circuitry, a second magnitude of the received signal in a second frequency range by applying a second bandpass filter to the received signal. The method includes determining, by the processing circuitry, that an electric arc has occurred on the conductor based on the first magnitude and the second magnitude.

Example 31

The method of example 30, wherein determining that the electric arc has occurred on the conductor comprises determining that the first magnitude and the second magnitude exhibit a predetermined mathematical relationship.

Example 32

The method of examples 30-31 or any combination thereof, wherein determining that the electric arc has occurred on the conductor comprises determining that a ratio of the first magnitude and the second magnitude exhibits an inverse-frequency relationship.

Example 33

The method of examples 30-32 or any combination thereof, wherein applying the first bandpass filter and the second bandpass filter comprises applying a single moving bandpass filter.

Example 34

The method of examples 30-33 or any combination thereof, wherein the single moving bandpass filter is configured as the first bandpass filter at a first time and configured as the second bandpass filter at a second time.

Example 35

The method of examples 30-34 or any combination thereof, wherein determining a third magnitude of the received signal in a third frequency range comprises applying a third bandpass filter to the received signal.

Example 36

The method of examples 30-35 or any combination thereof, further including generating confirming that the electric arc has occurred on the conductor based on the third magnitude when at least one parameter of a mathematical relationship for the electric arc is not known.

Example 37

The method of examples 30-36 or any combination thereof, further including determining the at least one parameter of the mathematical relationship.

Example 38

The method of examples 30-37 or any combination thereof, further including determining the at least one parameter of the mathematical relationship based on at least one of the magnitudes.

Example 39

The method of examples 30-38 or any combination thereof, further including determining a fourth magnitude of the received signal in a fourth frequency range by applying a fourth bandpass filter to the received signal.

Example 40

The method of examples 30-39 or any combination thereof, further including determining a level of steady-state noise based on the fourth magnitude.

Example 41

The method of examples 30-40 or any combination thereof, wherein the fourth frequency range is higher than the first, second, and third frequency ranges.

Example 42

The method of examples 30-41 or any combination thereof, further including determining a fifth magnitude of the received signal in a fifth frequency range by applying a fifth bandpass filter to the received signal.

Example 43

The method of examples 30-42 or any combination thereof, further including determining a level of noise injected by the load based on the fifth magnitude.

Example 44

The method of examples 30-43 or any combination thereof, further including determining a third magnitude of the received signal in a third frequency range by applying a third bandpass filter to the received signal.

Example 45

The method of examples 30-44 or any combination thereof, further including determining a level of steady-state noise based on the third magnitude when parameters of a mathematical relationship for the electric arc are known.

Example 46

The method of examples 30-45 or any combination thereof, further including determining a fourth magnitude of the received signal in a fourth frequency range by applying a fourth bandpass filter to the received signal.

Example 47

The method of examples 30-46 or any combination thereof, further including determining a level of noise injected by the load based on the fourth magnitude.

Example 48

The method of examples 30-47 or any combination thereof, further including determining a level of steady-state noise based on at least one of the magnitudes.

Example 49

The method of examples 30-48 or any combination thereof, further including determining a level of noise injected by the load based on the fifth magnitude.

Example 50

The method of examples 30-49 or any combination thereof, wherein apply the first bandpass filter comprises independently applying a first low-pass filter and a first high-pass filter to the received signal.

Example 51

The method of examples 30-50 or any combination thereof, wherein applying the second bandpass filter comprises independently applying a second low-pass filter and a second high-pass filter to the received signal.

Example 52

The method of examples 30-51 or any combination thereof, wherein determining the first magnitude comprises applying the first bandpass filter to generate a first filtered signal and applying a first RMS detector, a first quasi-RMS detector, or a first average detector to the first filtered signal.

Example 53

The method of examples 30-52 or any combination thereof, wherein determining the second magnitude comprises applying the second bandpass filter to generate a second filtered signal and applying a second RMS detector, a second quasi-RMS detector, or a second average detector to the second filtered signal.

Example 54

The method of examples 30-53 or any combination thereof, further including converting the received signal to a series of digital numbers.

Example 55

The method of examples 30-54 or any combination thereof, wherein determining the first magnitude in the first frequency range comprises applying the first bandpass filter to the series of digital numbers.

Example 56

The method of examples 30-55 or any combination thereof, wherein determining the second magnitude in the second frequency range comprises applying the second bandpass filter to the series of digital numbers.

Example 57

The method of examples 30-56 or any combination thereof, wherein the signal indicates the current through a power switch and through the conductor to the load.

Example 58

The method of examples 30-57 or any combination thereof, further including delivering a driving signal to the power switch to turn the power switch on or off.

Example 59

The method of examples 1-59 or any combination thereof, wherein the circuitry is configured to apply at least one of the bandpass filters as a fixed bandpass filter with a fixed frequency range.

Example 60

The method of examples 1-60 or any combination thereof, wherein the circuitry is configured to apply at least one of the bandpass filters as a moving bandpass filter that can be configured to with different frequency ranges at different times.

Example 61

The method of examples 1-61 or any combination thereof, wherein the circuitry is configured to apply both a fixed bandpass filter and a moving bandpass filter to the received signal.

Example 62

A device includes a computer-readable medium having executable instructions stored thereon, configured to be executable by processing circuitry for causing the processing circuitry to determine a first magnitude of a signal in a first frequency range by applying a first bandpass filter to the signal, wherein the signal indicates a current through a conductor to a load. The instructions are also configured to cause the processing circuitry to determine a second magnitude of a signal in a second frequency range by applying a second bandpass filter to the signal, wherein the signal indicates a current through a conductor to a load. The instructions are further configured to cause the processing circuitry to determine that an electric arc has occurred on the conductor based on the first magnitude and the second magnitude.

Example 63

The device of example 62, where the instructions are configured to cause the processing circuitry to perform the method of examples 30-61 or any combination thereof.

Example 64

A system includes means for receiving a signal indicating a current through a conductor to a load. The system also includes means for determining a first magnitude of the received signal in a first frequency range by applying a first bandpass filter to the received signal. The system further includes means for determining a second magnitude of the received signal in a second frequency range by applying a second bandpass filter to the received signal. The system includes means for determining that an electric arc has occurred on the conductor based on the first magnitude and the second magnitude.

Example 65

The system of example 64, further including means for performing the method of examples 30-61 or any combination thereof.

This disclosure has attributed functionality to devices 100, 200, and 300 and integrated circuit 500. Devices 100, 200, and 300 and integrated circuit 500 may include one or more processors. Devices 100, 200, and 300 and integrated circuit 500 may include any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, devices 100, 200, and 300 and integrated circuit 500 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as devices 100, 200, and 300 and integrated circuit 500. Example non-transitory computer-readable storage media may include RAM, ROM, programmable ROM (PROM), erasable programmable ROM (EPROM), electronically erasable programmable ROM (EEPROM), flash memory, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Various examples of the disclosure have been described. Any combination of the described systems, operations, or functions is contemplated. These and other examples are within the scope of the following claims.

What is claimed is:

1. A device comprising:
   at least one input node configured to receive a signal indicating a current through a conductor to a load; and
   circuitry configured to:
      determine a first magnitude of the received signal in a first frequency range by at least applying a first bandpass filter to the received signal;
      determine a second magnitude of the received signal in a second frequency range by at least applying a second bandpass filter to the received signal;
      determine a third magnitude of the received signal in a third frequency range by at least applying a third bandpass filter to the received signal;
      determine a level of steady-state noise based on the third magnitude; and
      determine that an electric arc has occurred on the conductor based on the first magnitude and the second magnitude.

2. The device of claim 1, wherein the circuitry is configured to determine that the electric arc has occurred on the conductor by at least determining that the first magnitude and the second magnitude exhibit a predetermined mathematical relationship.

3. The device of claim 2, wherein the circuitry is configured to determine that the electric arc has occurred on the conductor by at least determining that a ratio of the first magnitude and the second magnitude exhibits an inverse-frequency relationship.

4. The device of claim 1,
   wherein the circuitry is configured to apply the first bandpass filter and the second bandpass filter by at least applying a single moving bandpass filter, and
   wherein the single moving bandpass filter is configured as the first bandpass filter at a first time and configured as the second bandpass filter at a second time.

5. The device of claim 4,
   wherein the circuitry is configured to determine the third magnitude by at least applying a fixed bandpass filter to the received signal, and
   wherein the third frequency range comprises a fixed frequency range.

6. The device of claim 1, wherein the circuitry is configured to:
   determine a fourth magnitude of the received signal in a fourth frequency range by at least applying a fourth bandpass filter to the received signal; and
   confirm that the electric arc has occurred on the conductor based on the fourth magnitude when at least one parameter of a mathematical relationship for the electric arc is not known.

7. The device of claim 6, wherein the circuitry is configured to determine the at least one parameter of the mathematical relationship.

8. The device of claim 1, wherein the third frequency range is higher than the first and second frequency ranges.

9. The device of claim 6, wherein the circuitry is configured to:
   determine a fifth magnitude of the received signal in a fifth frequency range by at least applying a fifth bandpass filter to the received signal; and
   determine a level of noise injected by the load based on the fifth magnitude.

10. The device of claim 1, wherein the circuitry is configured to
   determine the level of steady-state noise based on the third magnitude when parameters of a mathematical relationship for the electric arc are known.

11. The device of claim 10, wherein the circuitry is configured to:
   determine a fourth magnitude of the received signal in a fourth frequency range by at least applying a fourth bandpass filter to the received signal; and
   determine a level of noise injected by the load based on the fourth magnitude.

12. The device of claim 1,
   wherein the circuitry is configured to apply the first bandpass filter by at least independently applying a first low-pass filter and a first high-pass filter to the received signal, and
   wherein the circuitry is configured to apply the second bandpass filter by at least independently applying a second low-pass filter and a second high-pass filter to the received signal.

13. The device of claim 12, wherein the circuitry is configured to apply the first low-pass filter and the second low-pass filter by at least applying a single low-pass filter to the received signal.

14. The device of claim 1,
   wherein the circuitry is configured to determine the first magnitude by at least applying the first bandpass filter to generate a first filtered signal and applying a first root-mean-square (RMS) detector, a first quasi-RMS detector, or a first average detector to the first filtered signal, and
   wherein the circuitry is configured to determine the second magnitude by at least applying the second bandpass filter to generate a second filtered signal and applying a second RMS detector, a second quasi-RMS detector, or a second average detector to the second filtered signal.

15. The device of claim 1, further comprising an analog-to-digital converter configured to convert the received signal to a series of digital numbers; wherein the circuitry comprises processing circuitry configured to:
   determine the first magnitude in the first frequency range by at least applying the first bandpass filter to the series of digital numbers; and
   determine the second magnitude in the second frequency range by at least applying the second bandpass filter to the series of digital numbers.

16. A method comprising:
   receiving, by at least one node of a device, a signal indicating a current through a conductor to a load;
   determining, by processing circuitry of the device, a first magnitude of the received signal in a first frequency range by at least applying a first bandpass filter to the received signal;
   determining, by the processing circuitry, a second magnitude of the received signal in a second frequency range by at least applying a second bandpass filter to the received signal;
   determining, by the processing circuitry, a third magnitude of the received signal in a third frequency range by at least applying a third bandpass filter to the received signal;
   determining, by the processing circuitry, a level of steady-state noise based on the third magnitude; and
   determining, by the processing circuitry, that an electric arc has occurred on the conductor based on the first magnitude and the second magnitude.

17. The method of claim 16, wherein determining that the electric arc has occurred comprises determining that a ratio of the first magnitude and the second magnitude exhibits an inverse-frequency mathematical relationship.

18. The method of claim 16, further comprising:
determining a fourth magnitude of the received signal in a fourth frequency range by at least applying a fourth bandpass filter to the received signal; and
confirming that the electric arc has occurred on the conductor based on the fourth magnitude when at least one parameter of a mathematical relationship for the electric arc is not known.

19. The method of claim 16, further comprising:
determining the level of steady-state noise based on the third magnitude when parameters of a mathematical relationship for the electric arc are known;
determining a fourth magnitude of the received signal in a fourth frequency range by at least applying a fourth bandpass filter to the received signal; and
determining a level of noise injected by the load based on the fourth magnitude.

20. A device comprising:
at least one input node configured to receive a signal indicating a current through a conductor to a load; and
circuitry configured to:
determine a first magnitude of the received signal in a first frequency range by at least applying a first bandpass filter to the received signal;
determine a second magnitude of the received signal in a second frequency range by at least applying a second bandpass filter to the received signal;
determine a third magnitude of the received signal in a third frequency range by at least applying a third bandpass filter to the received signal;
determine a level of noise injected by the load based on the third magnitude; and
determine that an electric arc has occurred on the conductor based on the first magnitude and the second magnitude.

21. The device of claim 20,
wherein the circuitry is configured to apply the first bandpass filter and the second bandpass filter by at least applying a single moving bandpass filter, and
wherein the single moving bandpass filter is configured as the first bandpass filter at a first time and configured as the second bandpass filter at a second time.

22. The device of claim 20,
wherein the circuitry is configured to determine the third magnitude by at least applying a fixed bandpass filter to the received signal, and
wherein the third frequency range comprises a fixed frequency range.

23. The device of claim 20, wherein the circuitry is configured to:
determine a fourth magnitude of the received signal in a fourth frequency range by at least applying a fourth bandpass filter to the received signal; and
confirm that the electric arc has occurred on the conductor based on the fourth magnitude when at least one parameter of a mathematical relationship for the electric arc is not known.

\* \* \* \* \*